United States Patent
Setty et al.

(10) Patent No.: US 6,784,521 B2
(45) Date of Patent: Aug. 31, 2004

(54) DIRECTIONAL COUPLER

(75) Inventors: Radha Setty, Staten Island, NY (US);
Wei Ping Zheng, Brooklyn, NY (US);
Igor Lumelskiy, Brooklyn, NY (US)

(73) Assignee: Scientific Components, Brooklyn, NY (US)

( * ) Notice: Subject to any disclaimer, the term of this patent is extended or adjusted under 35 U.S.C. 154(b) by 96 days.

(21) Appl. No.: 10/082,717

(22) Filed: Feb. 26, 2002

(65) Prior Publication Data

US 2002/0175780 A1 Nov. 28, 2002

Related U.S. Application Data

(60) Provisional application No. 60/292,440, filed on May 22, 2001.

(51) Int. Cl.[7] ............... H01L 39/00; H01L 29/40; H01P 5/12
(52) U.S. Cl. ............... 257/662; 257/663; 257/664; 333/109; 333/112; 333/118; 333/119; 333/115; 333/127
(58) Field of Search ............... 257/662, 663, 257/664; 333/109, 112, 118, 119, 115, 127

(56) References Cited

U.S. PATENT DOCUMENTS

| | | | | |
|---|---|---|---|---|
| 4,467,293 A | * | 8/1984 | Apel ............... 333/112 |
| 4,538,346 A | * | 9/1985 | Street ............... 29/602.1 |
| 5,015,972 A | * | 5/1991 | Cygan et al. ............... 333/32 |
| 5,557,245 A | * | 9/1996 | Taketa et al. ............... 333/116 |
| 5,926,076 A | * | 7/1999 | Johnson et al. ............... 333/109 |
| 6,114,924 A | * | 9/2000 | Cain et al. ............... 333/112 |
| 6,140,887 A | * | 10/2000 | Zheng ............... 333/112 |
| 6,198,374 B1 | * | 3/2001 | Abel ............... 336/200 |
| 2002/0175775 A1 | * | 11/2002 | Lillo et al. ............... 333/1 |

* cited by examiner

*Primary Examiner*—Amir Zarabian
*Assistant Examiner*—Ida M. Soward
(74) *Attorney, Agent, or Firm*—Kevin Redmond

(57) ABSTRACT

A directional coupler that has a small package size and repeatable electrical characteristics. The directional coupler includes a low temperature co-fired ceramic (LTCC) substrate with several layers. Electrical components such as resistors and capacitors are integrated within the LTCC substrate. A transformer is attached to the upper surface of the LTCC substrate and is electrically connected to the resistors and capacitors. The LTCC substrate has electrically conductive vias extending therethrough. The vias are used to make electrical connections between the layers of the LTCC substrate.

25 Claims, 10 Drawing Sheets

ELECTRICAL SPECIFICATIONS

| MODEL NO. | FREQ. RANGE (MHz) fl-fu | COUPLING (db) Nom. | COUPLING (db) Max. Flatness | MAINLINE LOSS (db) L Typ.Max. | MAINLINE LOSS (db) M Typ.Max. | MAINLINE LOSS (db) U Typ.Max. | DIRECTIVITY (db) L Typ.Min. | DIRECTIVITY (db) M Typ.Min. | DIRECTIVITY (db) U Typ.Min. | VSWR (:1) Typ. | POWER INPUT, W L Max. | POWER INPUT, W MU Max. |
|---|---|---|---|---|---|---|---|---|---|---|---|---|
| DBTC-9-4 | 5-1000 | 9.0±0.5 | ±0.5 | 1.2 2.0 | 1.2 1.8 | 1.5 2.0 | 21 17 | 18 13 | 15 -- | 1:30 | 0.5 | 1.0 |
| DBTC-10-4-75 | 5-1000 | 10.5±0.5 | ±0.7 | 1.5 2.2 | 1.4 2.0 | 1.5 2.0 | 21 16 | 20 13 | 16 -- | 1:30 | 0.5 | 1.0 |
| DBTC-12-4 | 5-1000 | 12.2±0.5 | ±0.9 | 0.9 1.8 | 0.7 1.3 | 1.1 1.6 | 33 22 | 21 14 | 15 -- | 1:30 | 0.5 | 1.0 |
| DBTC-13-4 | 5-1000 | 13.0±0.5 | ±0.6 | 0.7 1.3 | 0.7 1.3 | 1.1 1.6 | 21 17 | 18 13 | 13 -- | 1:30 | 0.5 | 1.0 |
| DBTC-13-5-75 | 5-1000 | 13.2±0.5 | ±0.6 | 0.9 1.4 | 1.0 1.5 | 1.1 1.6 | 21 17 | 19 14 | 18 -- | 1:30 | 0.5 | 1.0 |
|  | 1000-1500 | 13.6±0.5 | ±0.8 |  | 1.4 2.2 |  |  | 17 -- |  |  |  |  |
| DBTC-16-5-75 | 5-1000 | 16.3±0.5 | ±0.7 | 1.2 2.0 | 1.0 1.5 | 1.1 1.6 | 22 16 | 21 13 | 20 -- | 1:30 | 1.0 | 1.0 |
|  | 1000-1500 | 16.5±0.5 | ±0.7 |  | 1.3 1.9 |  |  | 19 -- |  | 1:30 | 1.0 | 1.0 |
| DBTCC-17-5 | 5-1000 | 17.0±0.7 | ±0.9 |  | 0.9 1.4 |  |  | 20 13 | -- -- | 1:30 | -- | 2.0 |
|  | 1000-1500 | 17.7±0.9 | ±1.0 |  | 1.0 1.5 |  |  | 20 10 |  | 1:30 | -- | 2.0 |
|  | 1500-2000 | 18.0±1.0 | ±0.8 |  | 1.1 1.6 |  |  | 14 -- |  | 1:30 | -- | 2.0 |
| DBTC-18-4-75 | 5-1000 | 18.2±0.5 | ±0.7 | 0.8 1.5 | 0.8 1.4 | 1.0 1.6 | 25 16 | 21 14 | 15 -- | 1:30 | 1.0 | 1.0 |
| DBTC-20-4 | 20-1000 | 20.4±0.6 | ±0.8 | 0.3 1.0 | 0.4 1.0 | 0.7 1.3 | 21 13 | 21 14 | 16 -- | 1:20 | 1.0 | 1.0 |

L=low range [$f_L$ to 10$f_L$]   M=midrange [10$f_L$ to $f_u$/2]   U=upper range [$f_u$/2 to $f_u$]

Fig. 12

DIRECTIONAL COUPLER

The present application claims priority to provisional patent application serial No. 60/292,440, filed on May 22, 2001, the contents of which are herein incorporated by reference in entirety.

BACKGROUND OF THE INVENTION

1. Field of the Invention

This invention relates to directional couplers in general and more particularly to a directional coupler having a small package size.

2. Description of the Prior Art

A directional coupler is a four port device. A directional coupler separates signals based on the direction of signal propagation. These devices are used to unequally split the signal flowing in the mainline. Referring to FIG. 1, a schematic diagram of a directional coupler is shown. Directional coupler 20 has an input port 22, an output port 24 and a coupled port 26. A termination port 28 is connected to a capacitor C and resistor R that are connected to ground. In an ideal situation some portion of the signal flowing into the input port 22 will appear at coupled port 26. Likewise any signal flowing into coupled port 26 will be coupled to input port 22. Output port 24 and coupled port 26 are isolated in that any signal flowing into port 24 will not appear at port 26 but will feed through to port 22. The RF directional coupler 20 is usually realized by two transformers 30 with a ferrite core that are connected.

Directional couplers have been made with ferrite transformers along with appropriate resistors and capacitors arranged around the ferrite transformer. These couplers provide multi-decade bandwidth. The directional coupler components are packaged on a printed circuit board. The transformer, resistors and capacitors are mounted to the printed circuit board. In some applications printed circuit board space can be extremely limited with additional space just not available. Unfortunately placing resistors and capacitors beside each transformer complicates the assembly program followed by the automated pick and place surface mount assembly equipment. This leads to lower production by the assembly machinery.

While directional couplers have been used, they have suffered from taking up excessive printed circuit board space and in being difficult to assemble. A current unmet need exists for a directional coupler that takes up less printed circuit board space and that can be easily assembled.

SUMMARY OF THE INVENTION

It is a feature of the invention to provide a directional coupler having a small package size that has repeatable electrical characteristics.

Another feature of the invention is to provide a directional coupler that includes a low temperature co-fired ceramic (LTCC) substrate. The LTCC substrate has several layers. Electrical components such as resistors and capacitors are integrated internal within the LTCC substrate. A transformer is attached to the upper layer of the LTCC substrate and is electrically connected to the resistors and capacitors. The transformer provides directional coupling. The LTCC substrate has electrically conductive vias extending therethrough. The vias are used to make electrical connections between layers of the LTCC substrate.

Another feature of the invention is to provide a directional coupler that takes up less printed circuit board space and has improved electrical repeatability.

A further object of the invention is to provide a method of manufacturing a miniature directional coupler.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention.

BRIEF DESCRIPTION OF THE DRAWINGS

In order that the invention may be more fully understood, it will now be described, by way of example, with reference to the accompanying drawings in which:

FIG. 12 is a table showing electrical specifications of several directional couplers built in accordance with the present invention.

It is noted that the drawings of the invention are not to scale. In the drawings, like numbering represents like elements between the drawings.

DETAILED DESCRIPTION OF THE PREFERRED EMBODIMENT(s)

Figure 1:
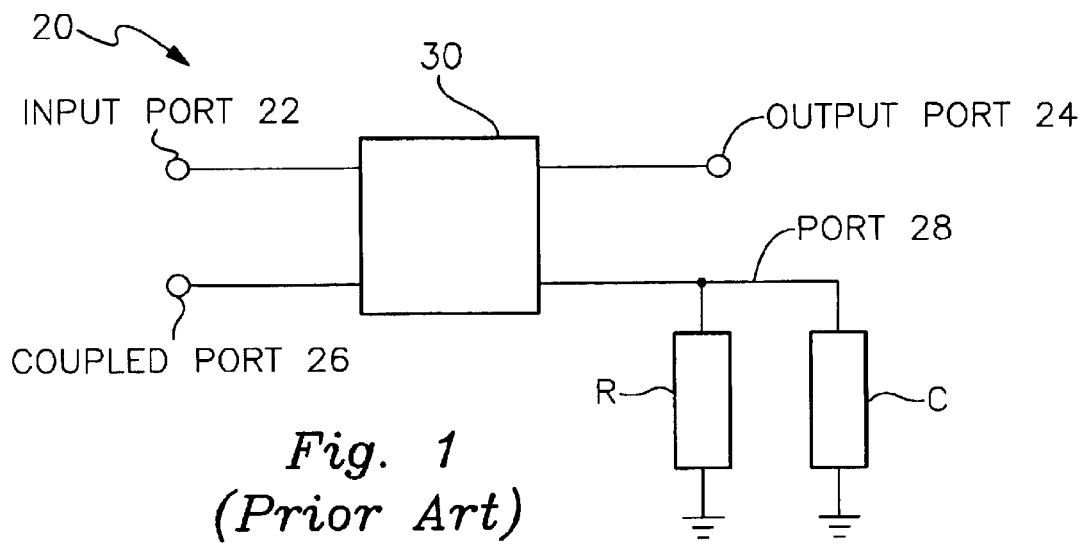
FIG. 1 is a block diagram of a directional coupler.
Figure 3:
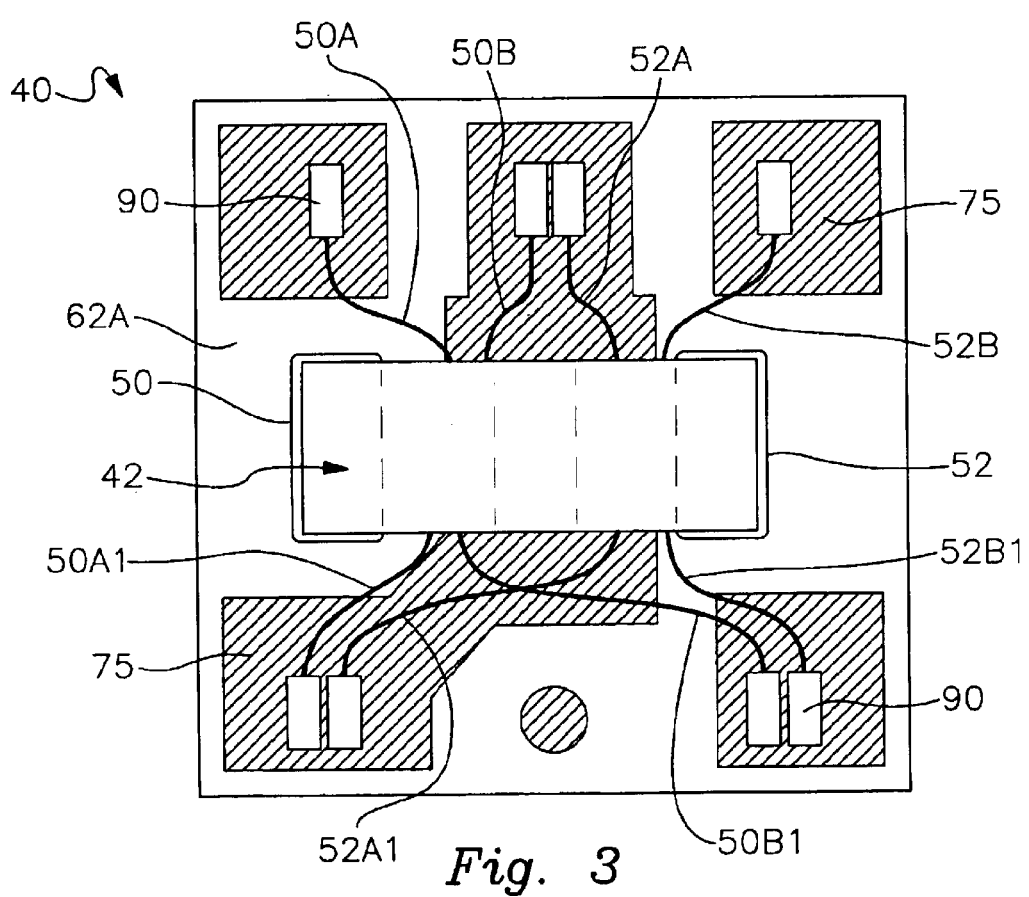
FIG. 3 is an assembled top view of FIG. 2.
Figure 2:
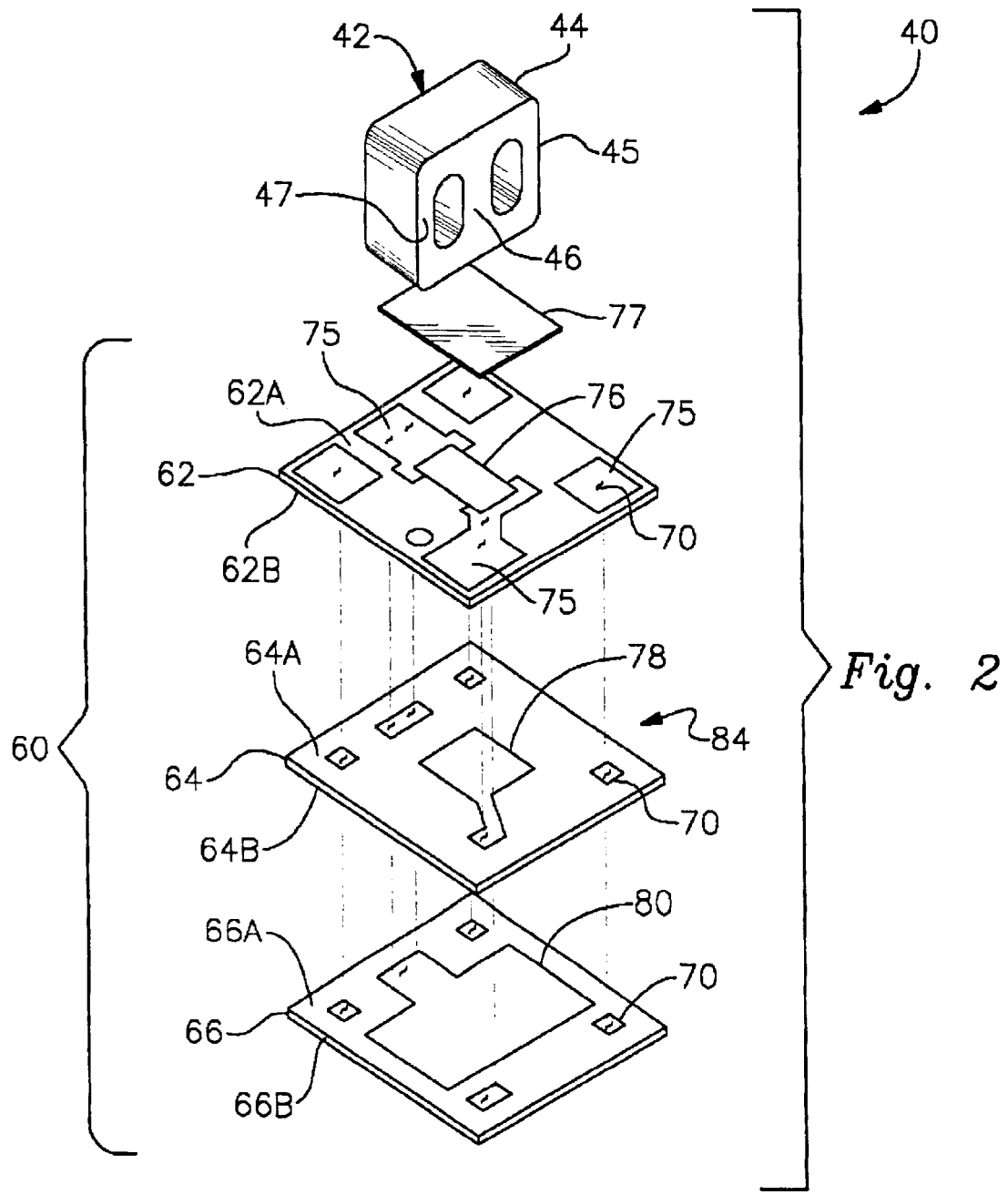
FIG. 2 is an exploded perspective view of the preferred embodiment of the present invention.
Figure 4:
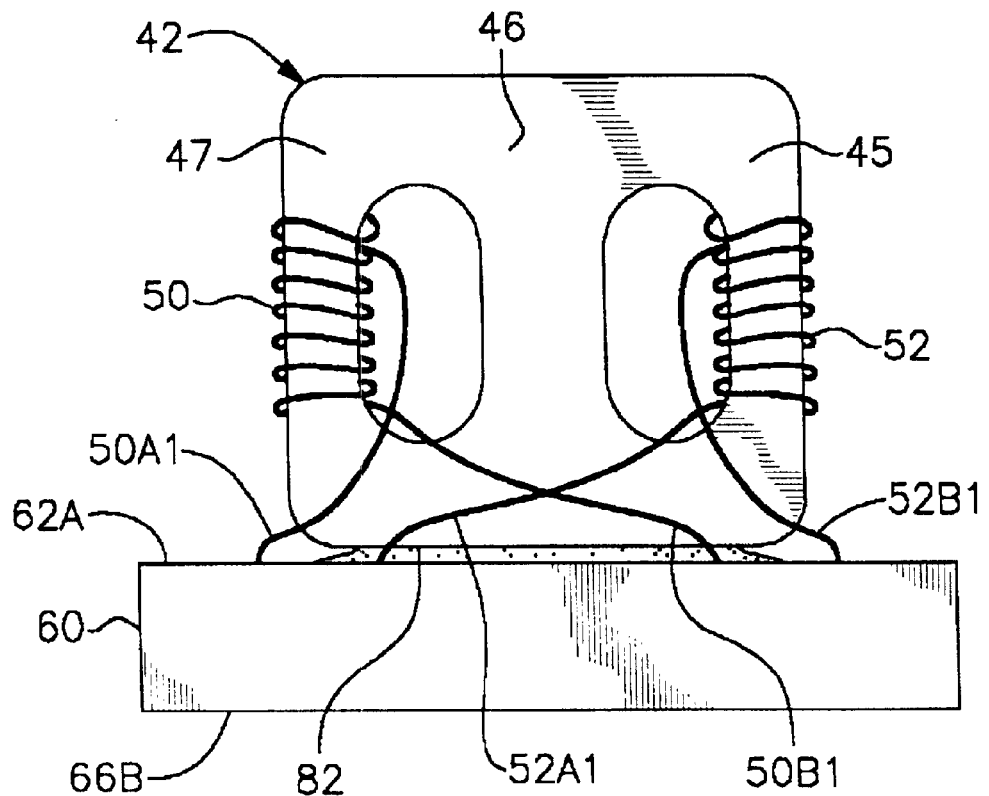
FIG. 4 is an assembled side view of FIG. 2.
Figure 5:
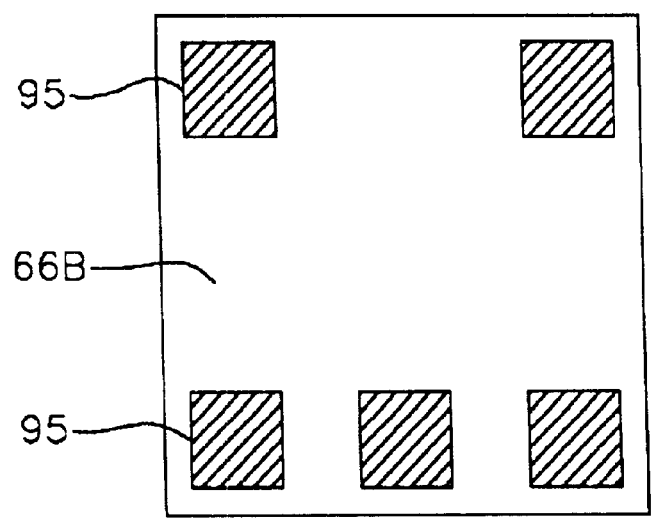
FIG. 5 is a bottom view of the LTCC substrate.

Referring to FIGS. 2–5, directional coupler 40 is shown. Directional coupler 40 has a transformer 42. Transformer 42 has a ferrite binocular core 44 with three legs 45, 46 and 47. A winding 50 is wound around leg 47. Winding 52 is wound around leg 45. Winding 50 has wires 50A, 50B, 50A1 and 50B1. Winding 52 has wires 52A, 52B, 52A1 and 52B1. Transformer 42 performs the directional coupling functions.

Transformer 42 is mounted to a low temperature co-fired ceramic (LTCC) structure or substrate 60 using an epoxy 82. LTCC substrate 60 is comprised of multiple layers of LTCC material. Planar layers 62, 64, and 66 are all stacked on top of each other and form a unitary structure 60 after firing in an oven. LTCC layers 62–66 are commercially available in the form of a green unfired tape from Dupont Corporation. Each of the layers has a top surface, 62A, 64A and 66A. Similarly, each of the layers has a bottom surface, 62B, 64B and 66B. The layers have several circuit features that are patterned on the top surfaces. Multiple vias 70 extend through each of the layers. Vias 70 are formed from an electrically conductive material and electrically connect one layer to another layer.

Layer 62 has several circuit features that are patterned on surface 62A. Surface 62A has several terminals 75 and a resistor 76. One of the terminals 75 forms RF input port S. Two of the terminals 75 form RF output ports 1 and 2. The terminals are electrically connected to vias 70. The resistor 76 has a protective overglaze 77 to protect the resistor from abrasion and shorting. Layer 64 has a capacitor electrode 78 formed on surface 64A. The electrode 78 is connected to one of vias 70. Layer 66 has a ground plane 80 formed on surface 66A. The ground plane 66 is connected to one of vias 70. The electrode 78, ground plane 80 and the insulative LTCC layers in between form a capacitor 84. Layer 66 has pads 95 that are formed on surface 68B.

The circuit features are formed by screening a conventional thick film paste material and firing in an oven. First, the LTCC layers have via holes punched, the vias are then filled with a conductive material. Next, the circuit features are screened onto the layers. The resistors are formed with a resistor material. The terminals, circuit lines and capacitor electrodes are formed with a conductive material. An insulative overglaze is screened over the resistor. The layers are then aligned and stacked on top of each other to form LTCC substrate 60. The LTCC structure 60 is then fired in an oven at approximately 900 degrees centigrade to form a unitary piece. Next, the transformer 42 is glued above surface 62A using an epoxy 82. Wires 50A–B and 52A–B are welded to terminals 75 using welds 90.

The directional coupler 40 would be mounted to a printed circuit board. The pads 95 on the bottom of surface 66B would be attached to the printed circuit board using a reflowed solder paste.

The present invention has several advantages. Since, the resistor 76 and capacitor 84 are integrated into the LTCC structure, they do not have to be mounted separately on the printed circuit board. This provides a savings of space on the printed circuit board and allows for a faster assembly process at lower cost.

Figure 6:
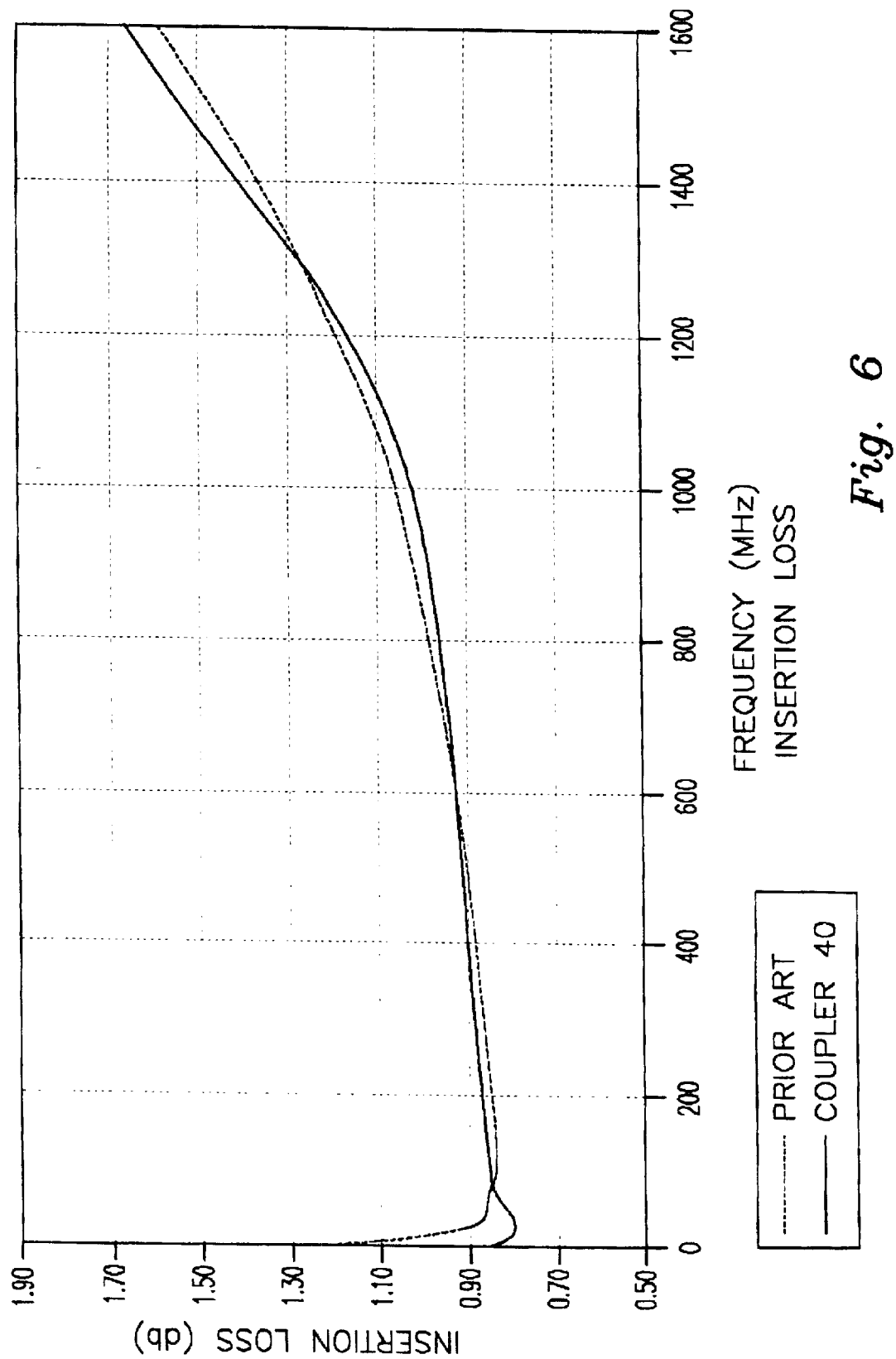
FIG. 6 is a graph showing insertion loss of the directional coupler.
Figure 7:
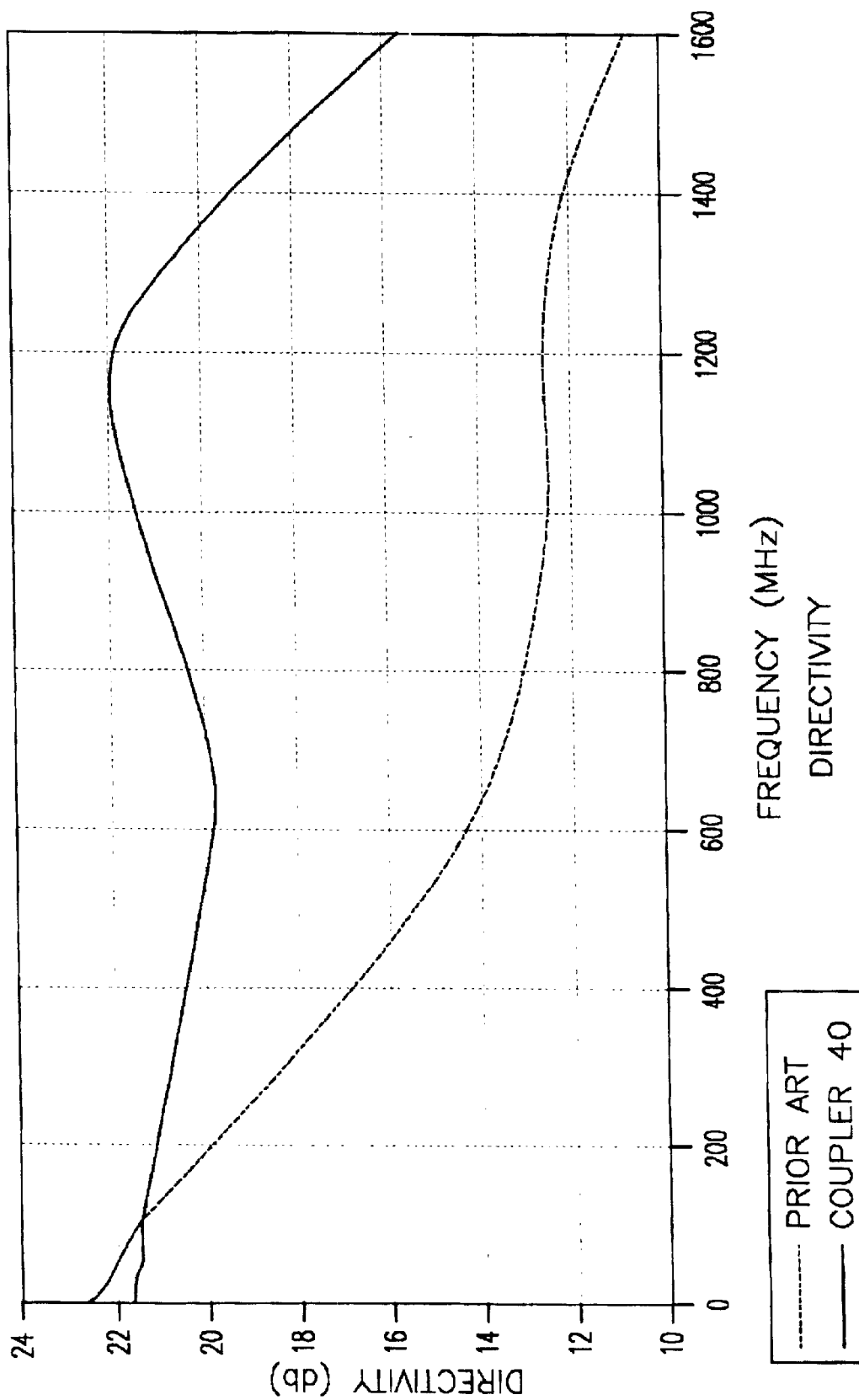
FIG. 7 is a graph showing directivity of the directional coupler.
Figure 8:
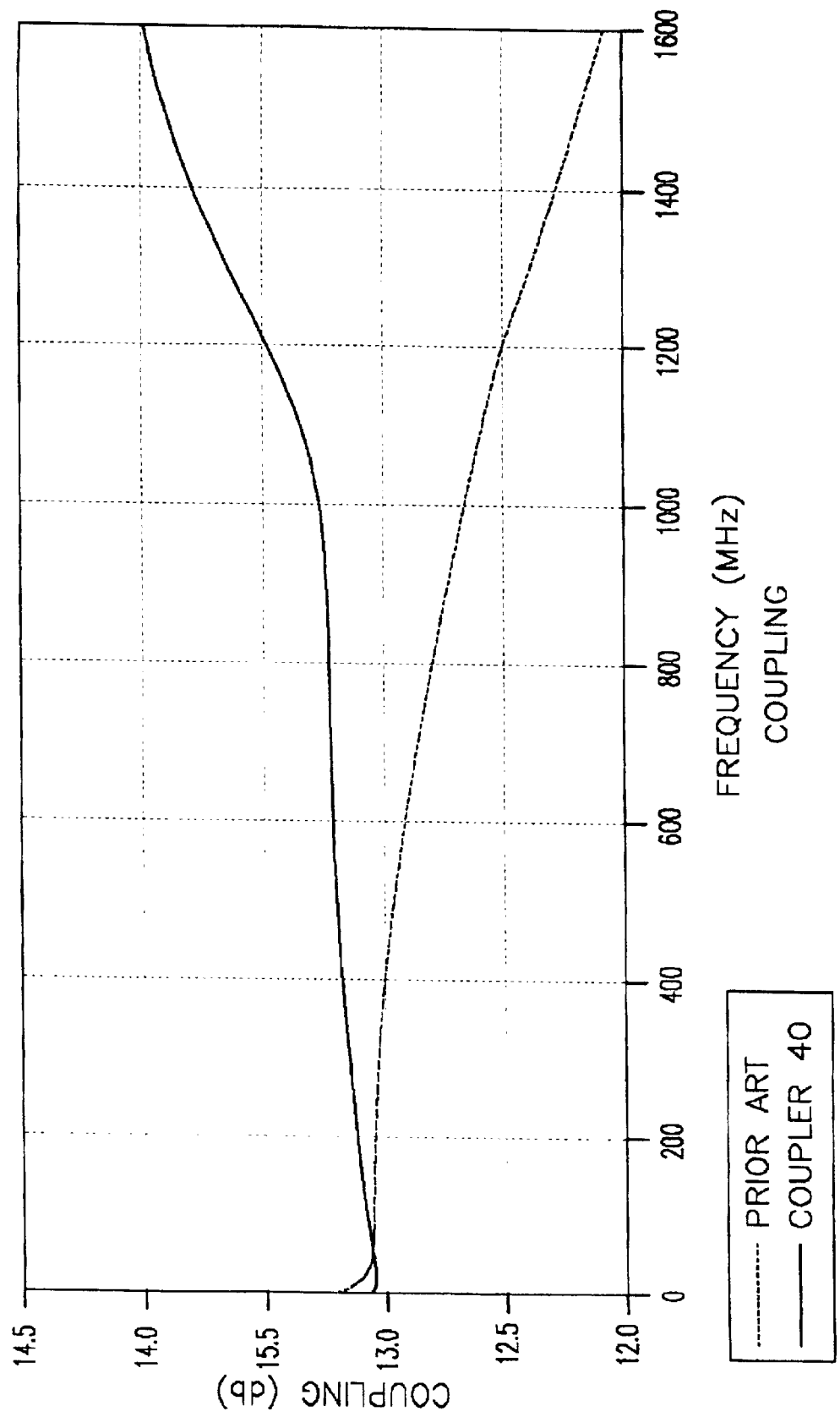
FIG. 8 is a graph showing coupling of the directional coupler.
Figure 9:
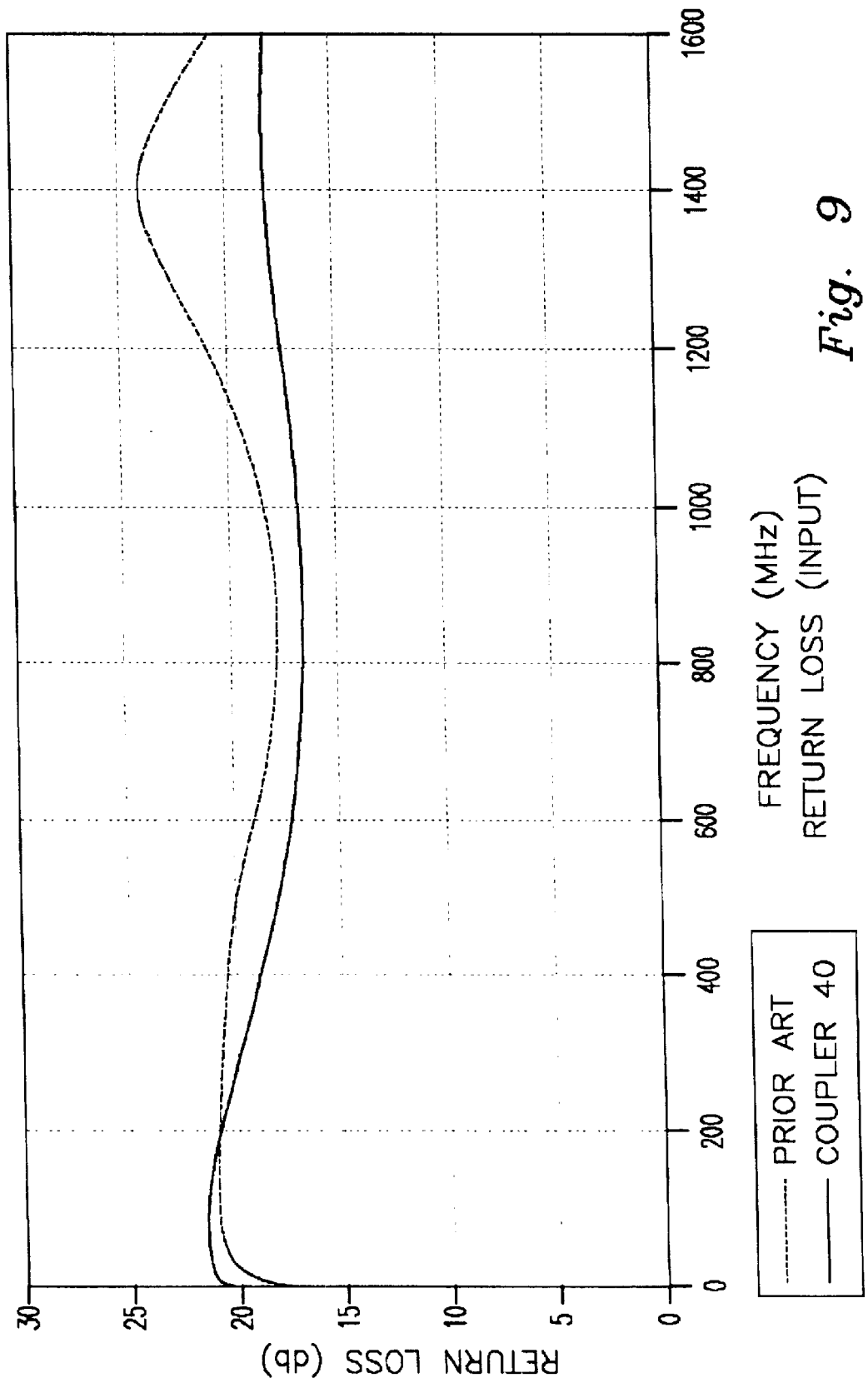
FIG. 9 is a graph showing return loss at the input of the directional coupler.
Figure 10:
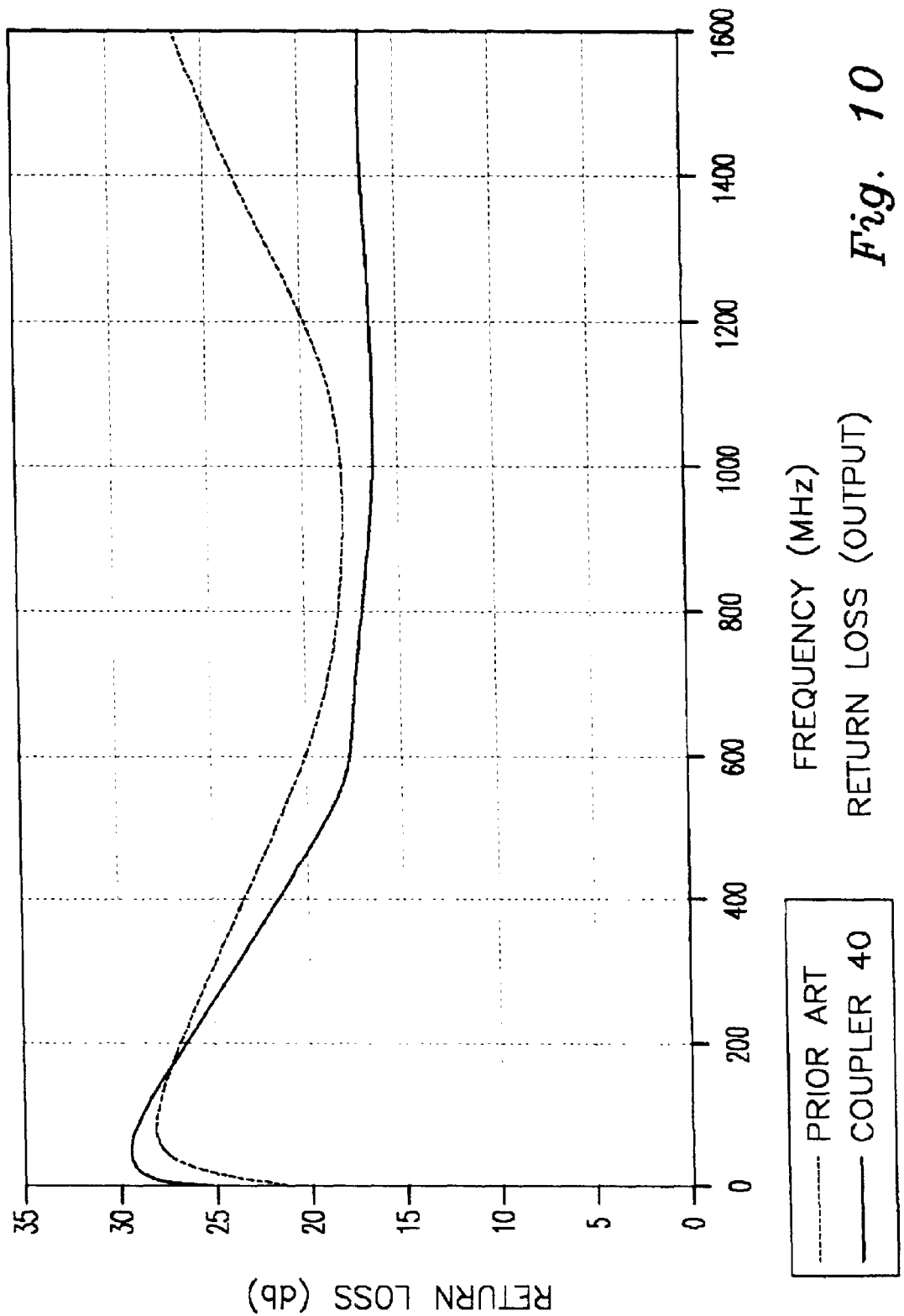
FIG. 10 is a graph showing return loss at the output of the directional coupler.
Figure 11:
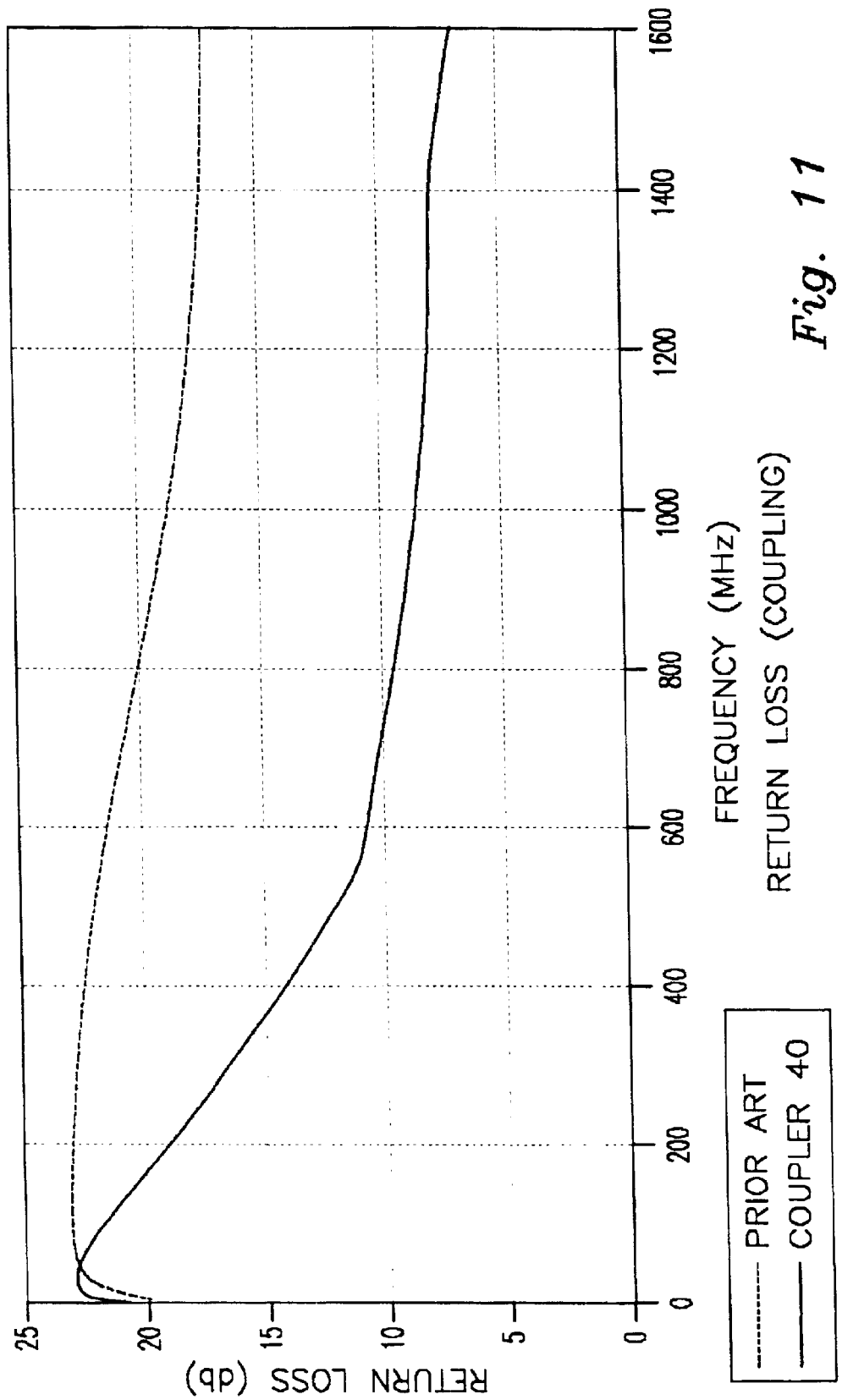
FIG. 11 is a graph showing coupled return loss of the directional coupler.

Repeatability of electrical performance is a prime concern for electrical design engineers. Fabricating the directional coupler using an LTCC process results in a more uniform electrical performance in the resulting coupler. FIGS. 6–11 show electrical performance data comparing a directional coupler of the prior art to a directional coupler made in accordance with the present invention. The coupler of the present invention is labeled coupler 40. The prior art coupler is referred to by the label prior art. Referring to FIG. 6, the insertion loss versus frequency is shown. The insertion loss is similar and is approximately 1 dB. FIG. 7 shows a graph of directivity versus frequency. The directivity for coupler 40 is 20 dB over the frequency band. This is a large improvement over the directivity of the prior art directional coupler. FIG. 8 is a graph showing coupling versus frequency. Directional coupler 40 shows a value of 13.3 dB up to 1000 MHz. FIGS. 9–11 show return loss versus frequency at the input port, the output port and the coupled port. The return loss is typically 20 dB (1.22:1) for the input and output ports. The return loss for coupler 40 at the coupled port is slightly lower than for the prior art coupler.

FIG. 12 is a table showing electrical specifications for several different directional couplers that were built and tested in accordance with the present invention. The directional couplers were tested over a frequency range of 5–1000 MHz.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A directional coupler comprising:
    a) a substrate having a plurality of layers;
    b) a film resistor formed on a top layers;
    c) a capacitor formed between two of the layers;
    d) a ground plane formed on one of the layers;
    e) a transformer attached to the top layer over the resistor, and the transformer electrically connected to the resistor and capacitor; and
    f) a plurality of vias extending between the layers for providing electrical connections between the resistor, capacitor, ground plane and transformer.

2. The coupler according to claim 1 wherein the substrate is formed from layers of low temperature co-fired ceramic.

3. The coupler according to claim 1 wherein the transformer has a binocular core having a first leg, a second lea and a third leg, a first winding wound on the first lea and a second winding wound on the third leg, the windings wound so as to directionally couple a plurality of ports.

4. The coupler according to claim 1 wherein an overglaze covers the resistor, the overglaze located between the resistor and the transformer.

5. The coupler according to claim 4 wherein a plurality of terminals are located on an upper layer.

6. The coupler according to claim 5 wherein the windings are electrically connected to the terminals by a plurality of welds.

7. The coupler according to claim 1 wherein the substrate is connected to a printed circuit board by a reflowed solder paste attached to at least one terminal on a bottom layer.

8. The coupler according to claim 1 wherein the capacitor has one electrode formed on one layer and a ground plane formed on another layer.

9. A coupler for providing coupling between an input port and a coupled port, the coupler having an output port and a terminated port, the coupler comprising:
    a) a multi-layered low temperature co-fired ceramic substrate, the substrate having a top surface and a bottom surface;
    b) a plurality of first terminals located on the top surface and a plurality of second terminals located on the bottom surface;
    c) a transformer attached to the top surface and electrically connected to the first terminals; and
    d) a plurality of vias extending through the substrate for providing an electrical connection between the first terminals and the second and
    e) a resistor formed on the top surface, under the transformer, the resistor electrically connected with the transformer.

10. The coupler according to claim 9 wherein an overglaze covers the resistor in order to protect the resistor from contacting the transformer.

11. The coupler according to claim 9 wherein a capacitor is formed in the substrate and is electrically connected between the transformer and a ground.

12. The coupler according to claim 11 wherein a ground plane is formed on the substrate and is electrically connected between the transformer and a ground.

13. The coupler according to claim 9 wherein the transformer has a binocular core and a plurality of windings.

14. The coupler according to claim 12 wherein the transformer is attached to the substrate using an epoxy.

15. The coupler according to claim 14 wherein the windings are electrically connected to the first terminals by a plurality of welds.

16. The coupler according to claim 9 wherein the substrate is connected to a printed circuit board by a reflowed solder paste attached to the second terminals on the bottom surface.

17. The coupler according to claim 11 wherein the capacitor is formed by an electrode and a ground plane having a layer of the low temperature co-fired ceramic therebetween, the electrode and the ground plane each connected to a via.

18. A coupler comprising:
   a) an input port, a coupled port, an output port and a terminated port;
   b) a resistor connected to the terminated port;
   c) a capacitor connected to the terminated port;
   d) a low temperature co-fired ceramic substrate having a plurality of layers, the resistor formed on a first layer and the capacitor being formed on the substrate;
   e) a transformer attached to the substrate and electrically connected to the ports;
   f) an overglaze located over the resistor for protecting the resistor; and
   g) a plurality of vias extending through the substrate for providing an electrical connection between the transformer, the resistor, the capacitor and the ports.

19. The coupler according to claim 18 wherein the capacitor is formed on a second layer.

20. The coupler according to claim 18 wherein a ground plane is formed on a third layer.

21. The coupler according to claim 18 wherein the transformer is electrically attached to a plurality of upper terminals on the first layer.

22. The coupler according to claim 20 wherein a plurality of bottom terminals are formed on the third layer.

23. The coupler according to claim 22 wherein the bottom terminals are connected to a printed circuit board.

24. The coupler according to claim 18 wherein the transformer has a binocular core and a plurality of windings.

25. The coupler according to claim 18 wherein an epoxy is located between the resistor overglaze and the transformer, the epoxy mechanically retaining the transformer to the first layer.

* * * * *